(12) United States Patent
Lin et al.

(10) Patent No.: US 7,714,248 B2
(45) Date of Patent: May 11, 2010

(54) MICROWAVE PLASMA GENERATOR

(75) Inventors: Kuan-Jiuh Lin, No. 108, Hsin-Hua Street, Taichung City (TW); Jun-Wei Su, Chia-Yi (TW); Chuen-Yuan Hsu, Yun-Lin Hsien (TW)

(73) Assignee: Kuan-Jiuh Lin, Taichung (TW)

( * ) Notice: Subject to any disclaimer, the term of this patent is extended or adjusted under 35 U.S.C. 154(b) by 627 days.

(21) Appl. No.: 11/439,742

(22) Filed: May 24, 2006

(65) Prior Publication Data

US 2007/0272663 A1 Nov. 29, 2007

(51) Int. Cl.
*B23K 10/00* (2006.01)
(52) U.S. Cl. .............................. 219/121.36; 219/121.43; 219/121.41; 118/723 MW; 156/345.48
(58) Field of Classification Search .............. 219/121.4, 219/121.43, 121.44; 156/345.36, 345.41, 156/345.48; 204/298.37, 298.38; 118/723 MW, 118/723 R
See application file for complete search history.

(56) References Cited

U.S. PATENT DOCUMENTS

| 7,303,790 | B2* | 12/2007 | Delaunay et al. | 427/571 |
| 2005/0271829 | A1* | 12/2005 | Kumar et al. | 427/569 |
| 2007/0164680 | A1* | 7/2007 | Kumar et al. | 315/111.21 |
| 2007/0183959 | A1* | 8/2007 | Charlier et al. | 423/447.1 |

\* cited by examiner

*Primary Examiner*—Mark H Paschall
(74) *Attorney, Agent, or Firm*—Charles E. Baxley

(57) ABSTRACT

The present invention discloses a microwave plasma generator which includes a chamber, a conductive inorganic substance, a trace gas and a microwave source. The conductive inorganic substance and the trace gas are housed in the chamber with an inner pressure about 0.001~10 torr. By irradiating the conductive inorganic substance and exciting the trace gas, clean and uniform plasma will be generated. The plasma generator of this invention is easily operated and can be applied to semiconductor manufacturing processes, for example, material modification, etching/cleaning, roughing and ion doping/hybrid.

8 Claims, 8 Drawing Sheets

(a)

(b)

(c)

(d)

(a)

(b)

(c)

(d)

MICROWAVE PLASMA GENERATOR

BACKGROUND OF THE INVENTION

1. Field of the Invention

The present invention relates to a microwave plasma generator, and particular to a microwave plasma generator which can be easily operated to generate clean and uniform plasma and applied to semiconductor manufacturing processes, for example, material modification, etching/cleaning, roughing and ion doping/hybrid.

2. Related prior Arts

Currently, plasma is applied in high technologies, for example, photoelectric devices and semiconductor manufacturing. The traditional plasma sources include the capacitive plasma source, the microwave plasma source, the inductive coupling plasma source, the electron cyclotron resonance plasma source, etc.

Among the above plasma sources, the microwave plasma source utilizes radio frequency electromagnetic waves to heat electrons and supply energy thereto. Features of the microwave plasma source can generate clean and high density plasma but not uniform. Therefore, the reactive chamber is limited in dimension. The electron cyclotron resonance plasma source utilizes electrons cycling in a magnetic field with a constant frequency and accelerating in a resonant frequency to generate uniform and high density plasma. However, the chamber of the electron cyclotron resonance plasma source is complicated. The inductive coupling plasma source utilizes a spiral coil as an electron source in a magnetic field to ionize a gas and generate plasma. The inductive coupling plasma source is easily achieved, but generally companioned with high temperature.

To comply with requirements in semiconductor manufacturing, it's necessary to develop a microwave plasma generator or source capable of generating stable and uniform plasma.

SUMMARY OF THE INVENTION

The present invention provides a microwave plasma generator or source which includes a chamber with an inner pressure about 0.001~10 torr, a conductive inorganic substance housed in the chamber, a trace gas housed in the chamber, and a microwave source for irradiating microwave on the conductive inorganic substance. Accordingly, plasma will be generated by irradiating the conductive inorganic substance and exciting the trace gas.

The trace gas can be an inert gas such as Ar, or $H_2$, $N_2$, $O_2$, etc. The conductive inorganic substance can be a carbon-based material, or has a regular structure or conductivity about $10^{-5}$~$10^6$ $Scm^{-1}$. The conductive inorganic substance is preferably a nanoscale substance, for example, carbon nanotubes. The conductive inorganic substance also can be carbon fibers, bamboo carbon fibers, graphite, highly oriented pyrolytic graphite, or one-dimension conductive nanowires; or a metal oxide, for example, an oxide of II, VI, III or V groups, preferably is a nanoscale metal oxide.

The microwave plasma generator can be applied to activating a material surface, modifying hydrophilicity/hydrophobicity, oxidizing functional groups on a plastic surface so as to promote hydrophilicity of the functional groups, or activating a metal surface.

The present invention also provides a plasma etcher/cleaner utilizing the microwave plasma generator, so that a substrate or a wafer housed in the chamber can be etched/cleaned by plasma.

DETAILED DESCRIPTION OF THE PREFERRED EMBODIMENTS

Figure 1:
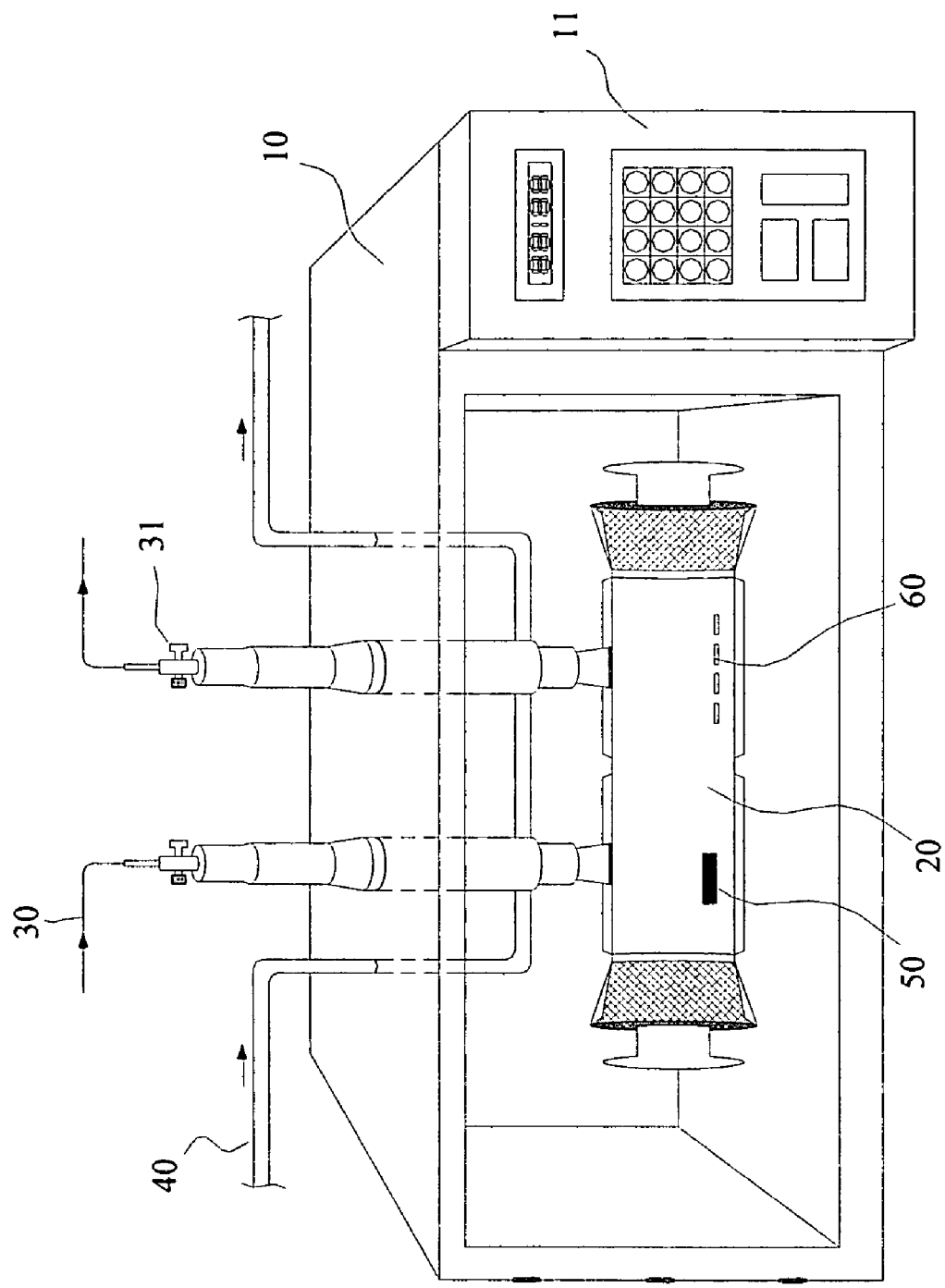
FIG. 1 illustrates a prototype of a microwave plasma generator in accordance with the present invention.

In the present invention, a prototype of a microwave plasma generator or source is modified from a household microwave oven with power about 2.45 GHz. As shown in FIG. 1, the microwave oven 10 includes a sealed container 20, a trace gas duct 30 and a cooling duct 40. Operation time and power of the microwave oven 10 can be set on a control panel 11. The trace gas duct 30 penetrates through a wall of the microwave oven 10 and delivers the trace gas into and out from the sealed container 20. The trace gas is transported by a low pressure pump and collected in an exhaust vessel. Valves 31 and other measuring meters (not illustrated) are installed on the duct 30 to regulate flow rate of the trace gas, for example, about 50 sccm, so that the microwave oven may remain an inner pressure about 10~0.001 torr, and preferably about 0.1~5 torr. The cooling duct 40 passes through the microwave oven 10 outside the sealed container 20, so as to cool the microwave oven with a fluid in the duct 40.

In this embodiment, power of the household microwave oven couldn't be precisely controlled. Therefore, a quartz container with an efficient cooling system will be desired as a high temperature about 1,000° C. may be reached when continuously used more than one hour. However, if a microwave source with a precise power controller can be applied and the reflected microwave can be retarded, then the cooling system will be unnecessary.

Carbon nanotubes 50 and a silicon sample 60 are placed in the sealed container 20. When the microwave oven 10 is turned on, carbon nanotubes 50 will emit light and electron beams to activate the trace gas to generate plasma. The plasma can be further applied to treatments of the silicon sample 60. In another embodiment, the silicon sample may be held with a holder disposed in the sealed container 20.

To identify effect of the present invention, the microwave plasma generator is applied to surface modification of silicon and poly(methyl methacrylate) (PMMA), etching/cleaning and roughing a metal film on the silicon sample into nanoparticles.

1. Modifying Hydrophilicity/hydrophobicity of a Material Surface

Figure 2:
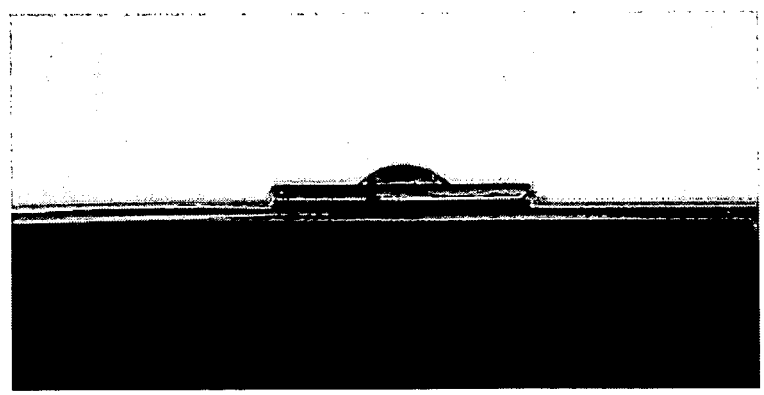
FIG. 2 shows the drop on the silicon sample modified with plasma.
Figure 2:
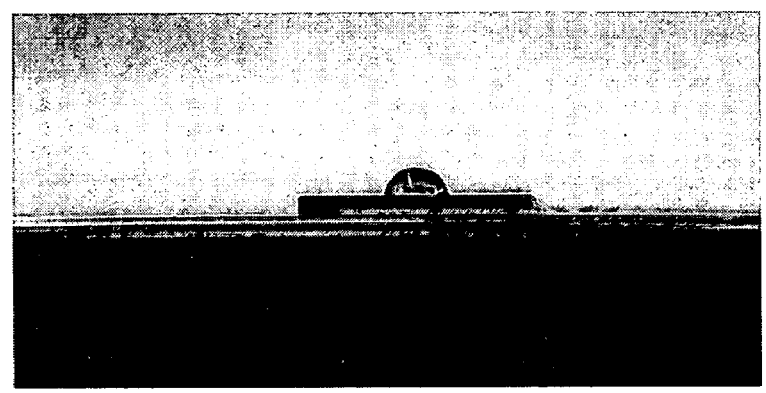
Figure 2:
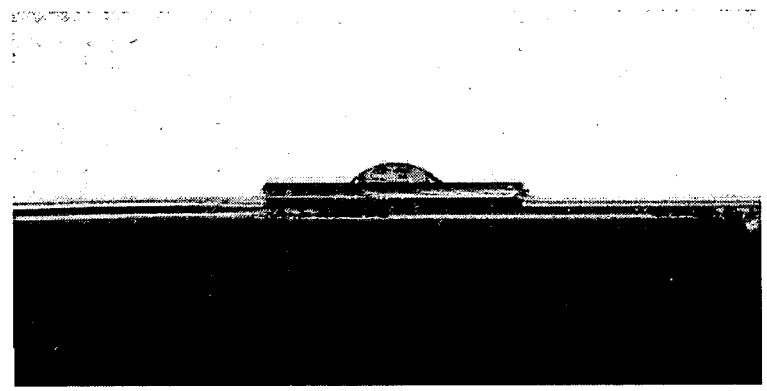
Figure 2:
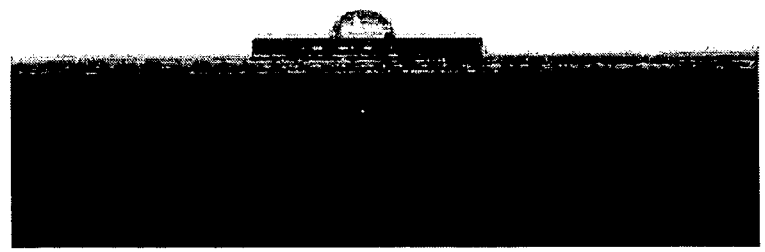
Figure 3:
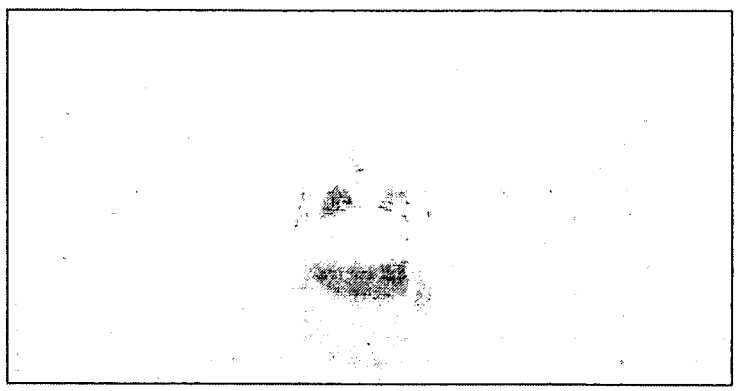
FIG. 3 shows the drop on the PMMA sample modified with plasma.
Figure 3:
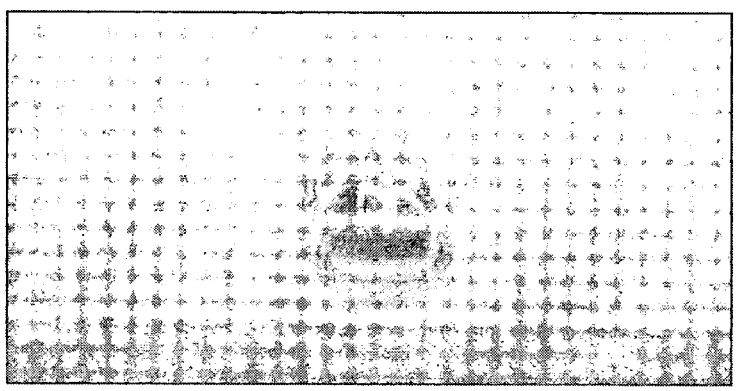
Figure 3:
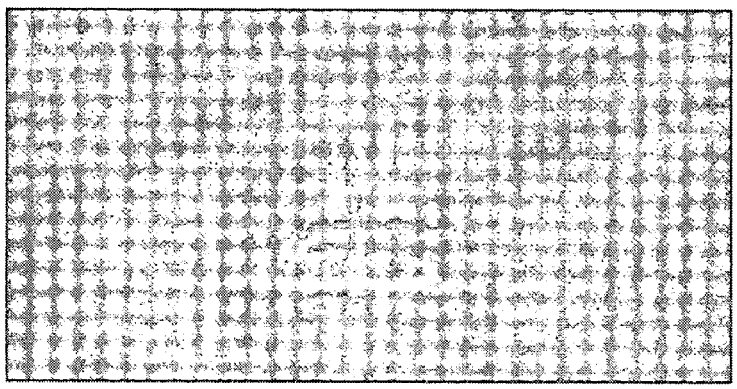
Figure 3:
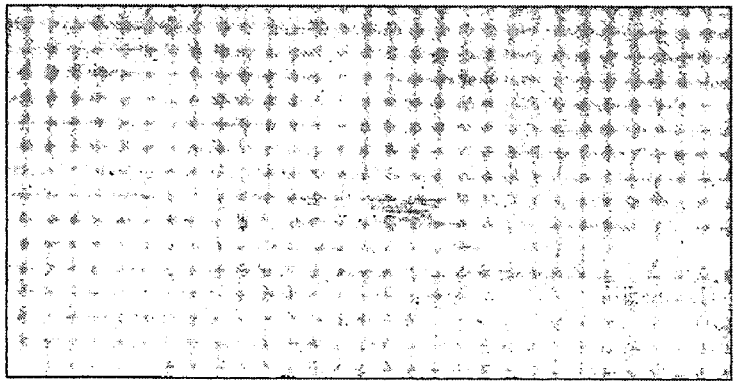

In this application, hydrophilicity/hydrophobicity is determined according to a contact angle of a water drop on a plane surface. The contact angle is formed by dropping 5 μL ultra-pure water from an elevation of 1 cm. The results are shown in FIGS. 2 and 3.

1.1 Silicon Sample
a. The silicon sample is first immersed in a solution ($H_2SO_4$: $H_2O_2$=3:1) for 30 minutes to increase hydrophilicity of functional groups thereon; and
   FIG. 2(*a*) shows the drop on the silicon sample is flat.
b. The silicon sample is then placed in the sealed container 20 of FIG. 1 with a few carbon nanotubes and treated with $N_2$ plasma or $H_2$ plasma for 30 seconds at 1~3 torr;
   FIG. 2(*b*) shows the drop on the silicon sample as half-sphere with a larger contact angle with the wafer, i.e., hydrophilicity decreases and hydrophobicity increase.
c. Step b is repeated but $O_2$ plasma or air plasma is used;
   FIG. 2(*c*) shows the drop on the silicon sample as flat as FIG. 2(*a*), i.e., hydrophobicity decreases and hydrophilicity increases.
d. Step b is repeated but the $N_2$ plasma or $H_2$ plasma is used again;
   FIG. 2(*d*) shows the drop on the silicon sample returning to a half sphere as FIG. 2(*b*), i.e., hydrophilicity decreases and hydrophobicity increases.

1.2 Poly(methyl methacrylate) (PMMA)
a. A PMMA sample is first cleaned with ethanol and dried with nitrogen;
   FIG. 3(*a*) shows the drop on the PMMA sample as a sphere with high hydrophobicity;
b. The sample is then placed in the sealed container 12 of FIG. 1 with carbon nanotubes and then treated with $N_2$ plasma or $O_2$ plasma for 1 second at 5 torr;
   FIG. 3(*b*) shows the drop on the PMMA sample presenting half-sphere, i.e., hydrophilicity increases and hydrophobicity decreases.
c. Step b is repeated but time for plasma treatment is 3 seconds;
   FIG. 3(*c*) shows the drop on the PMMA sample becoming flatter than FIG. 3(*b*), i.e., hydrophilicity further increases and hydrophobicity decreases.
d. Step b is repeated but time for plasma treatment is 5 seconds;
   FIG. 3(*d*) shows the drop on the PMMA sample becoming much flatter than FIG. 3(*c*), i.e., hydrophilicity significantly increases.

2. Cleaning Process

Plural silicon samples sized 1 cm×1 cm and carbon nanotubes are placed in the sealed container 12 of FIG. 1. Trace oxygen gas is activated by excited electrons of the carbon nanotubes irradiated with microwave and then generate $O_2$ plasma to eliminate impurities on the silicon surface.

Figure 4:
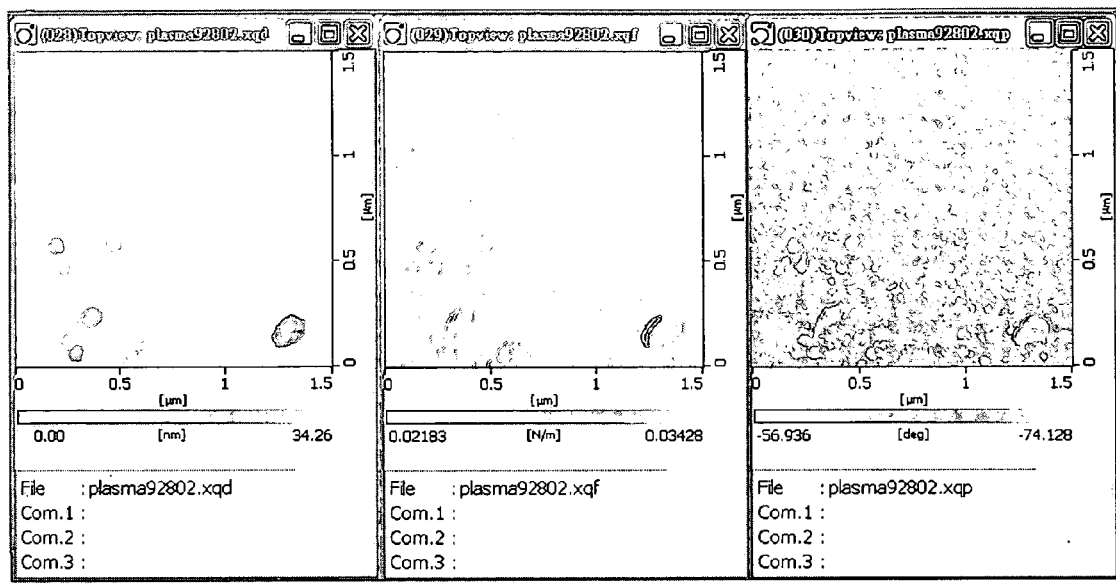
FIG. 4 shows AFM analysis of the silicon sample before and after cleaned with the microwave plasma generator.
Figure 4:
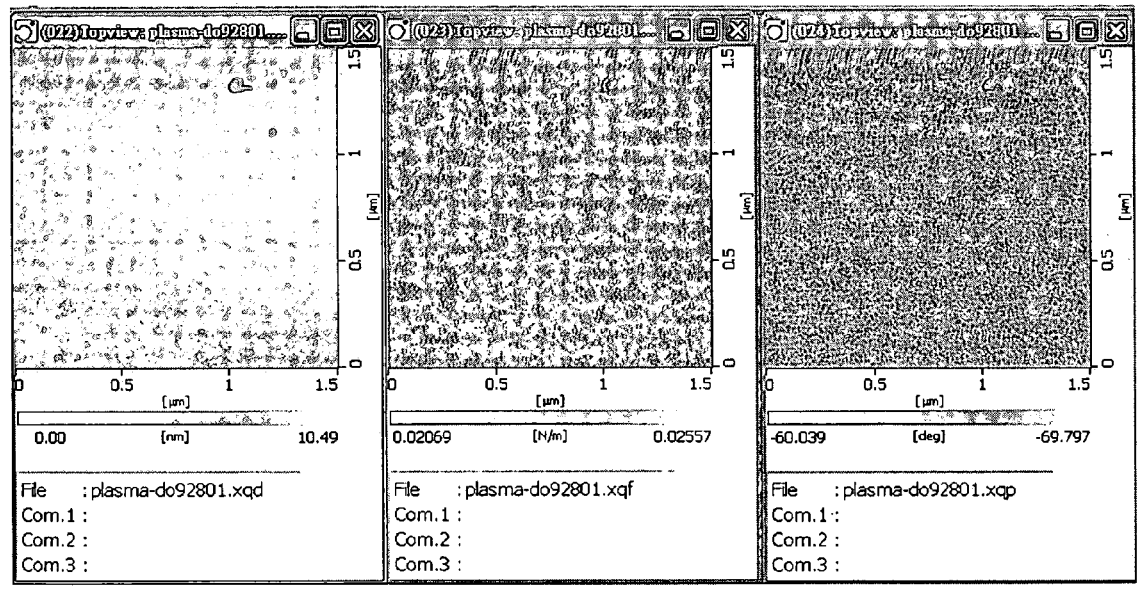

FIG. 4 shows AFM analysis of the silicon sample before and after cleaned with the microwave plasma generator of the present invention, in which (a1)~(a3) respectively show height, friction and appearance before cleaning; and (b1)~(b3) respectively show those after plasma cleaning.

Figure 5:
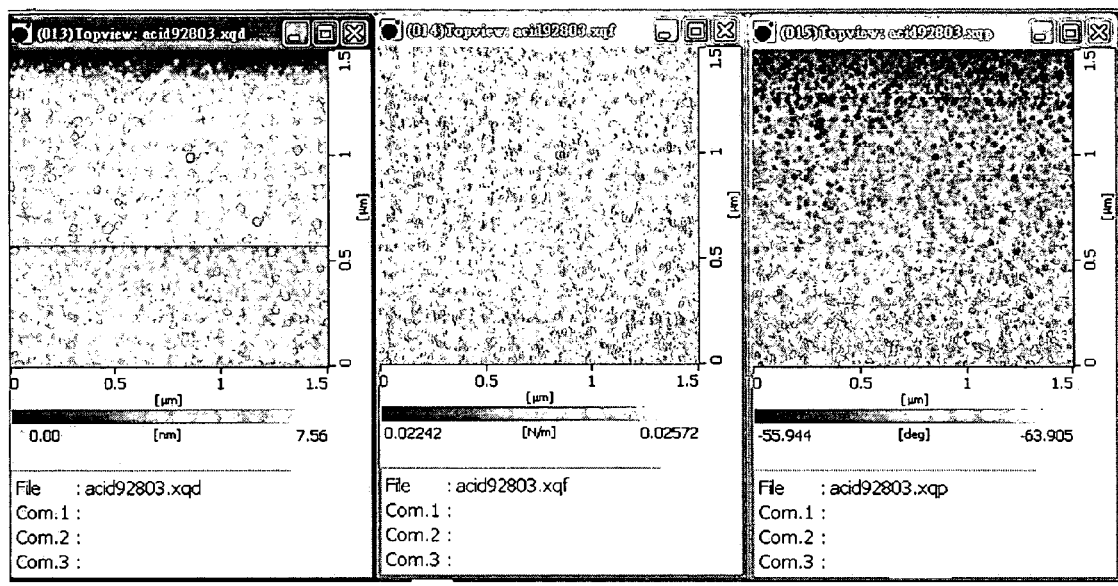
FIG. 5 shows AFM analysis of the silicon sample before and after cleaned with the traditional piranha solution.
Figure 5:
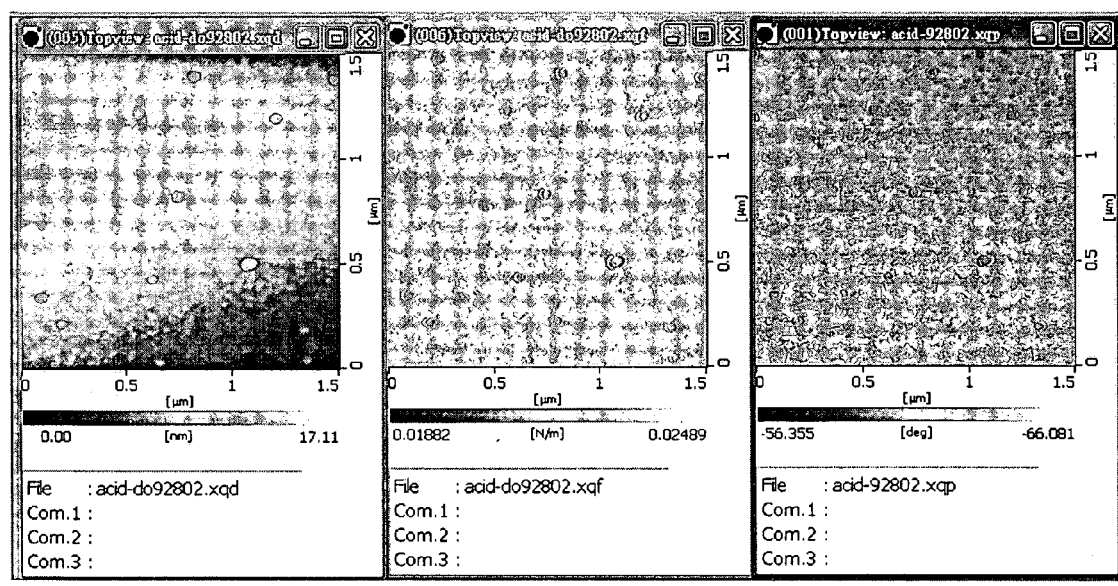

FIG. 5 shows AFM analysis of the silicon sample before and after cleaned with a traditional piranha solution, in which (a1)~(a3) (a1)~(a3) respectively show height, friction and appearance before cleaning; and (b1)~(b3) respectively show those after piranha cleaning.

Comparing results of FIGS. 4 and 5, it's obvious that plasma cleaning performs lower and more uniform height and friction to the silicon surface than piranha cleaning.

3. Roughing the Film Surface by Plasma Etching

Silicon samples each having a thin metal film are placed in the sealed container 12 of FIG. 1 with carbon nanotubes. Trace gas is activated by excited electrons of the carbon nanotubes irradiated with microwave and then generate plasma. Surfaces of the metal films with thickness about 10~30 nm will be etched and roughed as nanoparticles by the plasma. By changing etching time, density and size of the nanoparticles can be controlled. The films on the silicon samples can be made by any suitable metal, for example, plasma sputtering deposition.

Figure 6:
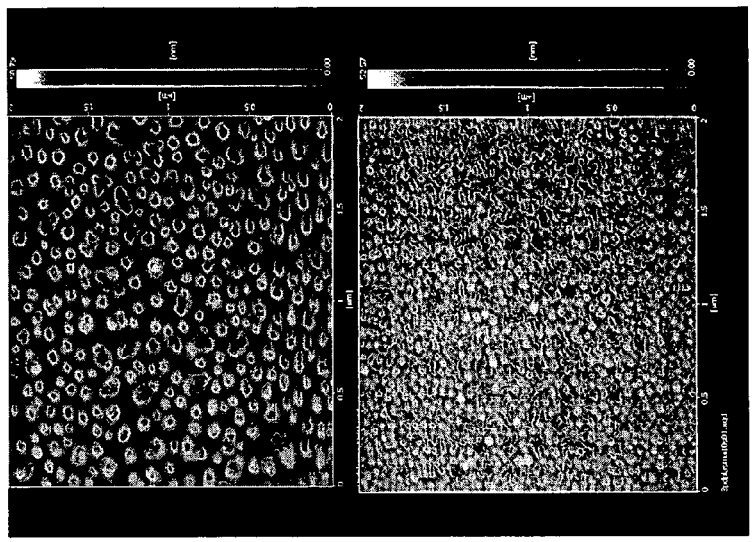
FIG. 6 illustrates AFM analysis of the Au nanoparticles during etching with $O_2$ plasma.
Figure 6:
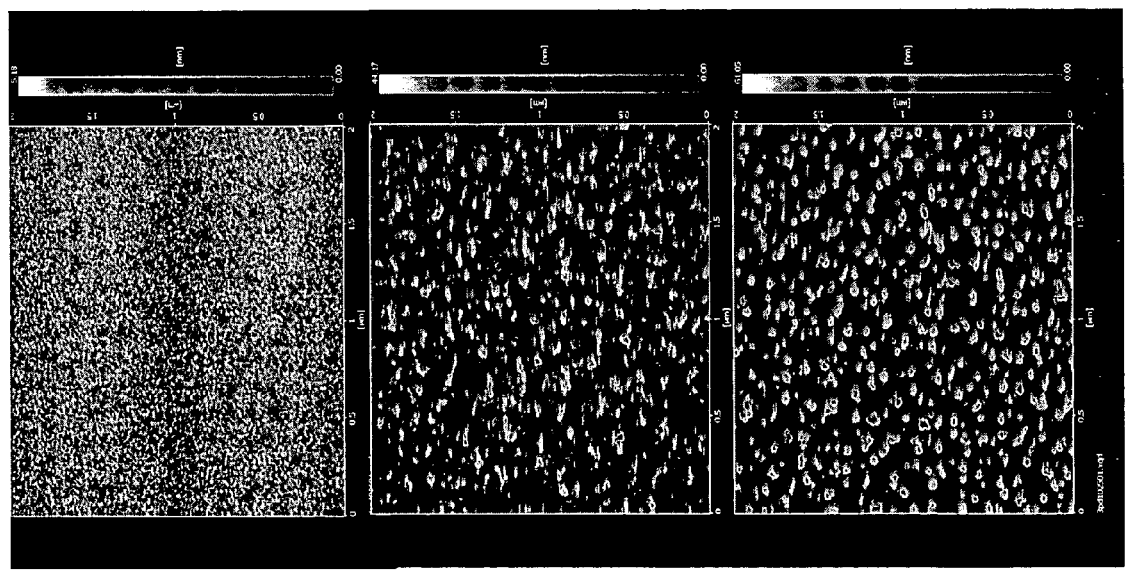
Figure 7:
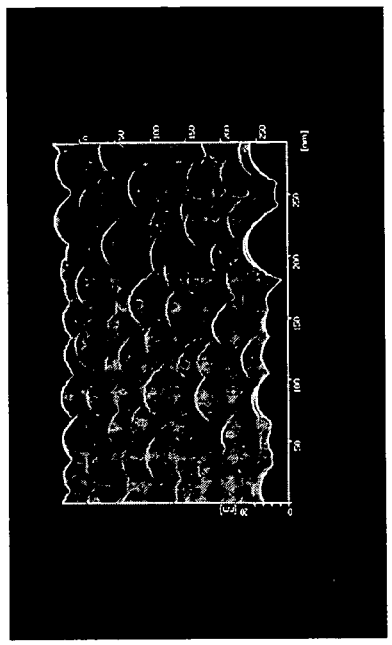
FIG. 7 illustrates AFM analysis of Pd nanoparticles and Au nanoparticles.
Figure 7:
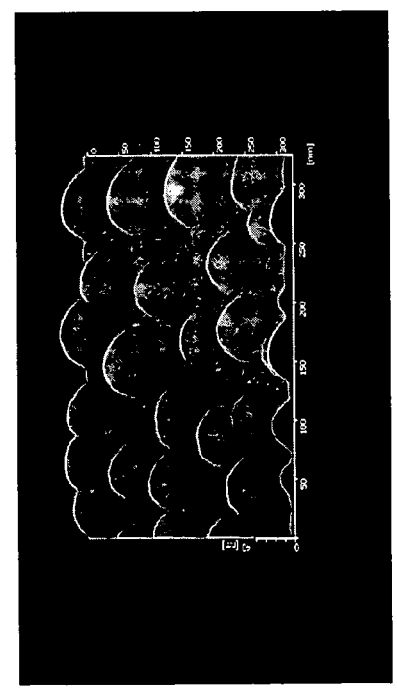

In FIG. 6, (*a*)~(*e*) respectively illustrate AFM analysis of the Au nanoparticles on the film surface when etched with air plasma for 0 second, 10 seconds, 15 seconds, 20 seconds and 25 seconds, at 1.5 torr. In FIG. 7, (*a*) and (*b*) respectively illustrate AFM analysis of Pd nanoparticles and Au nanoparticles, on which metal particles are uniformly distributed on the silicon surfaces.

Figure 8:
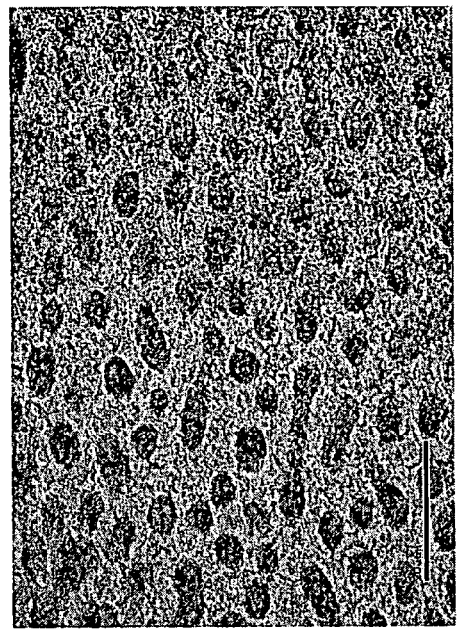
FIG. 8 illustrates SEM analysis and TEM analysis of the Au nanoparticles.
Figure 8:
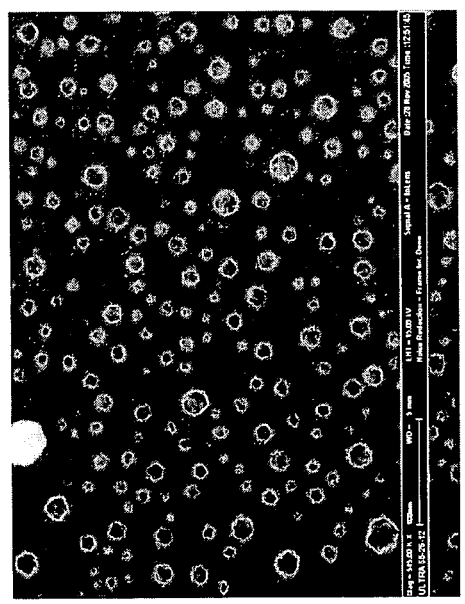

In FIG. 8, (*a*) and (*b*) respectively illustrate SEM analysis and TEM analysis of the Au nanoparticles which are formed with air plasma for 30 seconds at 1.5 torr.

4. Forming Holes by Plasma Etching

Without flowing gas into and out from the sealed container 20, specific holes can be formed on the silicon sample by etching with air plasma for 120 seconds at 1~3 torr.

Figure 9:
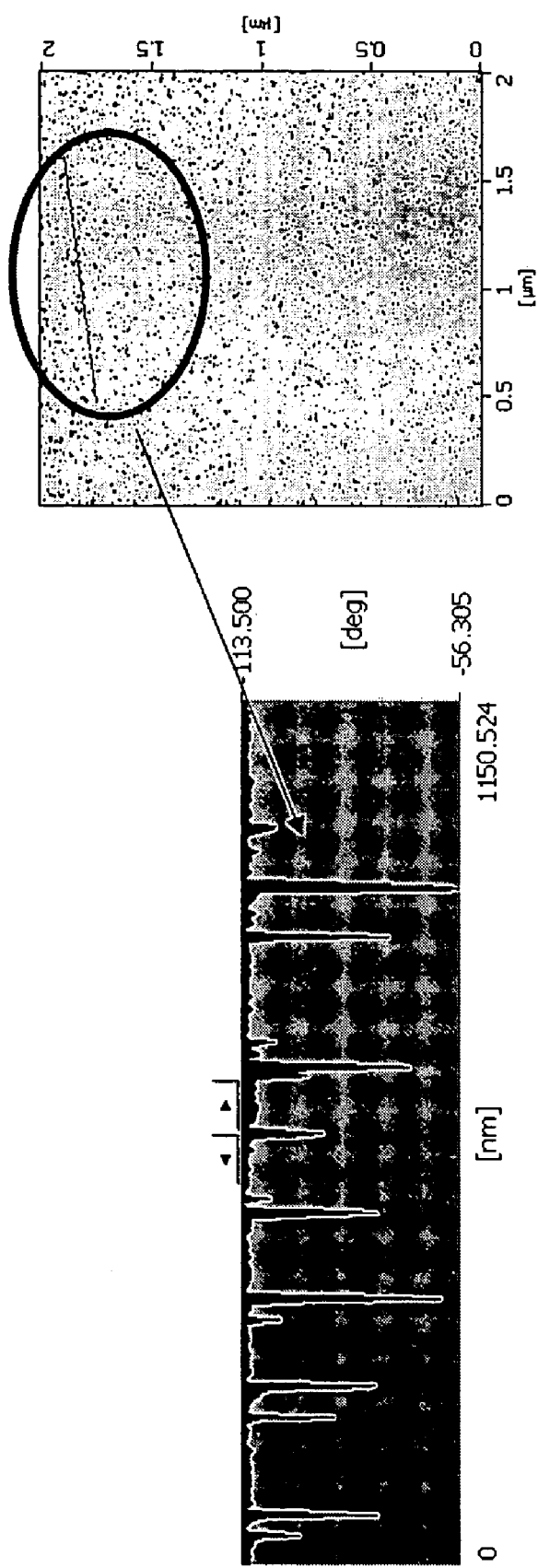
FIG. 9 shows depths of the etched holes of the silicon sample with AFM analysis.

FIG. 9 indicates depths of the holes with AFM analysis, in which periodic variation is observed. This result implies that the microwave plasma generator of the present invention will be suitable for ion doping or hybrid of inorganic semiconductor and manufacturing lattice holes. Further, such surface defects can be utilized in process of doping inorganic, for example, light-sensitive solar cell of $TiO_2$ which has a huge energy level and thus absorbs UV light of very short wavelength. The surface defects may reduce the energy level and facilitate $TiO_2$ to absorb visible light.

What is claimed is:

1. A microwave plasma generator, comprising:
   a chamber with an inner pressure about 0.1~5 torr;
   carbon nanotubes housed in the chamber;
   a trace gas housed in the chamber wherein the trace gas is selected from the group consisting of Ar, $H_2$, $N_2$, and $O_2$; and
   a microwave source for irradiating microwave on the carbon nanotubes;
   accordingly, plasma will be generated by irradiating the carbon nanotubes and exciting the trace gas to be transformed into plasma;
   wherein the plasma is applied to activating a material surface, modifying hydrophilicity/hydrophobicity, or oxidizing functional groups on a plastic surface so as to promote hydrophilicity of the functional groups.

2. The microwave plasma generator as claimed in claim 1, further comprising a cooling unit for cooling down heat generated during exciting the trace gas to generate plasma.

3. The microwave plasma generator as claimed in claim 1, further comprising a shield for preventing microwave emitting outside the chamber.

4. The microwave plasma generator as claimed in claim 1, further comprising a gas supplying unit for supplying the trace gas in a stable flow rate.

5. The microwave plasma generator as claimed in claim 1, wherein the trace gas is supplied in a flow rate of about 50 sccm.

6. The microwave plasma generator as claimed in claim 1, which is applied to activating a metal surface.

7. A plasma etcher/cleaner, comprising the microwave plasma generator as claimed in claim 1, so that a substrate or a wafer housed in the chamber can be etched/cleaned by plasma generated from the microwave plasma generator.

8. The plasma etcher/cleaner as claimed in claim 7, further comprising: a holder disposed in the chamber of the microwave plasma generator to hold the substrate or wafer.

* * * * *